United States Patent [19]

Shibata et al.

[11] Patent Number: 4,868,444

[45] Date of Patent: Sep. 19, 1989

[54] SURFACE ACOUSTIC WAVE DEVICE

[75] Inventors: Kenichi Shibata; Toshiaki Yokoo; Kousuke Takeuchi, all of Hirakata; Toshiharu Tanaka, Higashiosaka; Maruo Kamino, Hirakata, all of Japan

[73] Assignee: Sanyo Electric Co., Ltd., Moriguchi, Japan

[21] Appl. No.: 259,557

[22] Filed: Oct. 18, 1988

[30] Foreign Application Priority Data

Oct. 19, 1987 [JP] Japan .................................. 62-264736
Nov. 9, 1987 [JP] Japan .................................. 62-283969

[51] Int. Cl.$^4$ ............................................... H01L 41/08
[52] U.S. Cl. ....................................... 310/313 A; 333/154
[58] Field of Search ...................... 310/313 A; 333/154

[56] References Cited

U.S. PATENT DOCUMENTS

| | | | |
|---|---|---|---|
| 4,511,816 | 4/1985 | Mikoshiba et al. | 310/313 A |
| 4,567,393 | 1/1986 | Asai et al. | 310/313 A |
| 4,571,519 | 2/1986 | Kawabata et al. | 310/313 A |

*Primary Examiner*—Mark O. Budd
*Attorney, Agent, or Firm*—Armstrong, Nikaido, Marmelstein, Kubovcik & Murray

[57] ABSTRACT

A surface acoustic wave device having a single crystal aluminum nitride film wherein when the direction of propagation of the surface acoustic wave is expressed by $(\lambda,\mu,\theta)$ according to the Euler angle notation, $\theta$ is set to 90 degrees, $\lambda$ to a desired angle, and $\theta$ to an angle in the range of 30 to 150 degrees. In a surface acoustic wave device having a c-axis-oriented aluminum nitride film, the direction of c-axis orientation of the piezoelectric film is inclined within a plane containing the direction of propagation of the surface acoustic wave and perpendicular to the surface of the piezoelectric film at an angle in the range of about ±30 degrees to about ±150 degrees with respect to a normal to the piezoelectric film. The devices are 1.122% in maximum coupling coefficient.

8 Claims, 4 Drawing Sheets

SURFACE ACOUSTIC WAVE DEVICE

FIELD OF THE INVENTION

The present invention relates to surface acoustic wave devices wherein aluminum nitride is used as a piezoelectric material.

BACKGROUND OF THE INVENTION

Surface acoustic wave devices are small-sized and stable to temperature and to variations with time, can be adapted to give the desired filter characteristics by varying the configuration of comblike electrodes and therefore find wide application, for example, to IF filters for television receivers, IF filters for satellite broadcasting, RF converter oscillators for VTRs, etc.

In recent years, especially, great efforts are directed to the development of high frequency surface acoustic wave devices for use in pocket pagers, mobile radio telephones and the like. Attention has been focused on surface acoustic wave devices of this type which include a single crystal aluminum nitride film or a C-axis-oriented aluminum nitride film as a piezoelectric film assuring a high wave propagation velocity.

Surface acoustic wave devices incorporating a single crystal aluminum nitride film are disclosed in IEEE Transaction on Sonics and Ultrasonics, Vol. SU-32, No. 5, September 1985, "Zero-Temperature-Coefficient SAW Devices on AlN Epitaxial Films." Further surface acoustic wave devices including a c-axis-oriented aluminum nitride film are disclosed in Applied Physics Letter, Vol. 36, No. 8, pp. 643-645, 15 Apr. 1980, "Low-temperature growth of piezoelectric AlN film by rf reactive planar magnetron sputtering."

It is desired that surface acoustic wave devices be as great as possible in effective surface acoustic wave coupling coefficient $K^2$ which represents the efficiency of conversion of electrical energy to surface acoustic wave energy. For example, it has been proposed to give an improved coupling coefficient to surface acoustic wave devices employing a single crystal lithium tetraborate substrate by suitably selecting the direction of propagation of the wave (Unexamined Japanese Patent Publication SHO 59-4309).

However, full research has yet to be made on improvements in the coupling coefficient of surface acoustic wave devices employing an aluminum nitride (AlN) film. For example, the device disclosed in the foregoing IEEE Transaction, which comprises a single crystal film of (1120)[0001] AlN formed on a substrate of (0112)[0111] $Al_2O_3$ is as low as 0.8% in coupling coefficient $K^2$.

The device having a c-axis-oriented aluminum nitride film and disclosed in the above-mentioned Applied Physicas Letter has a very low coupling coefficient $K^2$ of 0.12%.

SUMMARY OF THE INVENTION

The main object of the present invention is to provide a surface acoustic wave device comprising a single crystal aluminum nitride film or a c-axis-oriented aluminum nitride film serving as a piezoelectric film and having a greater coupling coefficient than conventionally possible.

To fulfill the above object, we have conducted research and theoretically found that with the surface acoustic wave device comprising a single crystal aluminum nitride film as a piezoelectric film, the coupling coefficient of the device can be greatly increased by inclining the crystal orientation of the piezoelectric film with respect to a normal to the piezoelectric film, and further that with the surface acoustic wave device comprising a c-axis-oriented aluminum nitride film as a piezoelectric film, the coupling coefficient of the device can be greatly increased by inclining the direction of the c-axis orientation of the piezoelectric film with respect to a normal to the film. Thus, the present invention has been accomplished.

When the direction of propagation of a surface acoustic wave in the surface acoustic wave device having a single crystal aluminum nitride film is expressed as $(\lambda,\mu,\theta)$ according to the Euler angle notation, $\theta$ is set to 90 degrees as in the prior art, $\lambda$ to a desired angle, and $\mu$ to an angle in the range of 30 to 150 degrees, preferably about 56 degrees or about 124 degrees. Conventionally, $\mu$ is set to about 0 degree.

With the surface acoustic wave device having a c-axis-oriented aluminum nitride film, the direction of c-axis orientation of the piezoelectric film is inclined within a plane containing the direction of propagation of a surface acoustic wave and perpendicular to the surface of the piezoelectric film at an angle in the range of about ±30 degrees to about ±150 degrees, preferably at about ±56 degrees or about ±124 degrees, with respect to a normal to the piezoelectric film. Conventionally, the angle of inclination is about 0 degree.

Setting the angles $\lambda$, $\mu$ and $\theta$ of the single-crystal aluminum nitride film as stated above is equivalent in terms of elasticity to setting the direction of c-axis orientation of the c-axis-oriented aluminum nitride film as state above, and these two modes of setting produce the same effect with respect to the propagation of surface acoustic waves. This has been recognized by us and is also apparent from the analysis of the crystal structures.

Consequently, both the devices theoretically have a coupling coefficient of up to a maximum of 1.122% which is a great improvement over a maximum of 0.8% conventionally available. The coupling coefficient was calculated by the numerical analysis of a model of surface acoustic wave device which is generally accepted as being highly reliable as will be described below, using a computer. Apparently, therefore, the theoretical value of coupling efficient given above has high accuracy.

DESCRIPTION OF THE PREFERRED EMBODIMENTS

Figure 1:
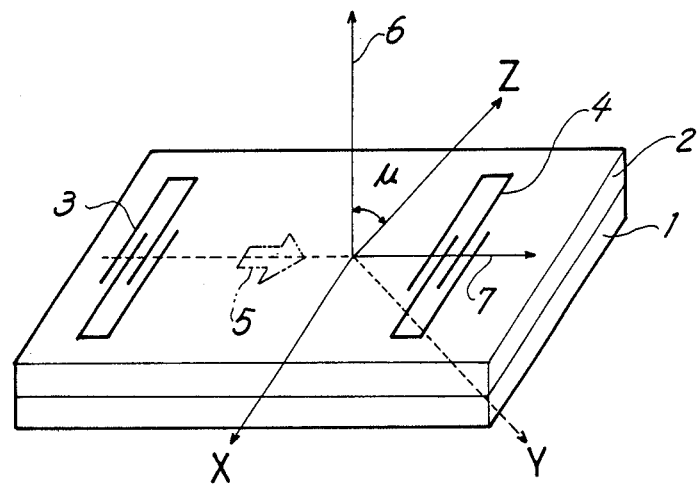
FIG. 1 is a perspective view of a surface acoustic wave device comprising a single crystal aluminum nitride film.
Figure 2:
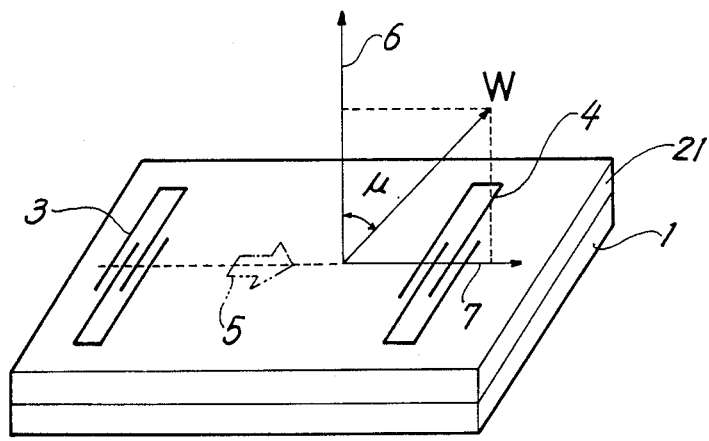
FIG. 2 is a perspective view of a surface acoustic wave device comprising a c-axis oriented aluminum nitride film.

FIG. 1 shows an example of surface acoustic wave device comprising a single crystal aluminum nitride film 2, and FIG. 2 shows an example of surface acoustic wave device comprising a c-axis-oriented aluminum nitride film 21. The single crystal or c-axis-oriented AlN film 2 or 21 has a thickness corresponding to several wavelengths of a surface acoustic wave (e.g., a thickness of 20 to 30 micrometers) and is formed on a substrate 1. A transmitting electrode 3 and a receiving electrode 4, each resembling a comb, are arranged as opposed to each other on the surface of the AlN film. The surface acoustic wave propagates from the transmitting electrode 3 toward the receiving electrode 4 in the direction of arrow 5.

These devices will be described below in detail. (Embodiment of surface acoustic wave device having single crystal AlN film)

Figure 5:
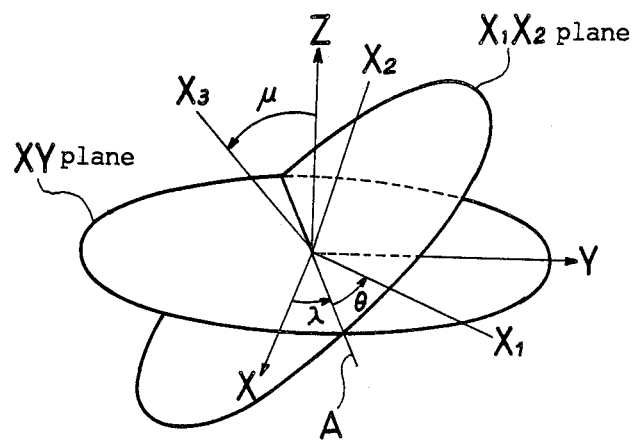
FIG. 5 is a diagram for illustrating the Euler angle notation.

FIG. 5 is a diagram for illustrating how to express the direction of propagation of surface acousstic wave in the Euler angle notation. The diagram shows X-axis, Y-axis and Z-axis which represent the crystal axes crystallographically characteristic of the single crystal of aluminum nitride. The direction of propagation of the surface acoustic wave is represented by $X_1$-axis, the direction of a normal to the surface of the piezoelectric film by $X_3$-axis, and the direction perpendicular to $X_1$-axis and to $X_3$-axis by $X_2$-axis.

Suppose a line of intersection, A, of $X_1$-$X_2$ plane containing $X_1$-axis and $X_2$-axis with X-Y plane containing X-axis and Y-axis makes an angle of $\theta$ with $X_1$-axis, and the angle between the line of intersection A and X-axis is $\lambda$, and the angle between Z-axis and $X_3$-axis is $\mu$. The direction of propagation of the surface acoustic wave is then expressed by ($\lambda$, $\mu$, $\theta$), and this system is referred to as the Euler notation.

The angles $\lambda$, $\mu$ and $\theta$ are each in the range of 0 to 180 degrees and respectively include angles ($\lambda$+180), ($\mu$+180) and ($\theta$+180) each involving a difference of 180 degrees in phase.

With reference to FIG. 1, the substrate 1 is made of sapphire, silicon single crystal, glass or quartz. The single crystal AlN film 2 is formed over the substrate 1. The direction 7 of propagation of the surface acoustic wave through the film 2 is at right angles with X-axis of the crystal and represented by $\lambda=0$ and $\theta=90$ in the Euler notation.

In the course of accomplishing the present invention, we checked the device for variations in coupling coefficient when the angle $\mu$ between a normal 6 to the piezoelectric film and Z-axis of the crystal shown in FIG. 1 was altered from 0 degree to 180 degrees.

The coupling coefficient can be calculated by the known method disclosed, for example, in IEEE Transaction on Sonics and Ultrasonics, Vol. SU-15, No. 4, October 1968, pp. 209-217, "A Method for Estimating Optical Crystal Cuts and Propagation Direction for Excitation of Piezoelectric Surface Waves," and the Foundation of Japan Acoustics Society, material for 14th Technical Institute (April 1977), "Communication with Surface Acoustic Waves and Application to Signal Processing," pp. 8-19.

According to this calculation method, the coupling coefficient is determined by the numerical analysis of a model of surface acoustic wave device which comprises a basic piezoelectric equation which is prepared considering the anisotropy and piezoelectric characteristics of the AlN film, Newton's equation of motion, Maxell's electromagnetic equations, etc. This method is generally accepted as having high accuracy. We conducted the numerical analysis of the model of surface acoustic wave device with high precision using Newton's method, etc. to thereby calculate the surface acoustic wave propagation velocity Vm through the AlN film when the film is covered with a complete conductor and the propagation velocity Vf at the free surface.

Figure 3:
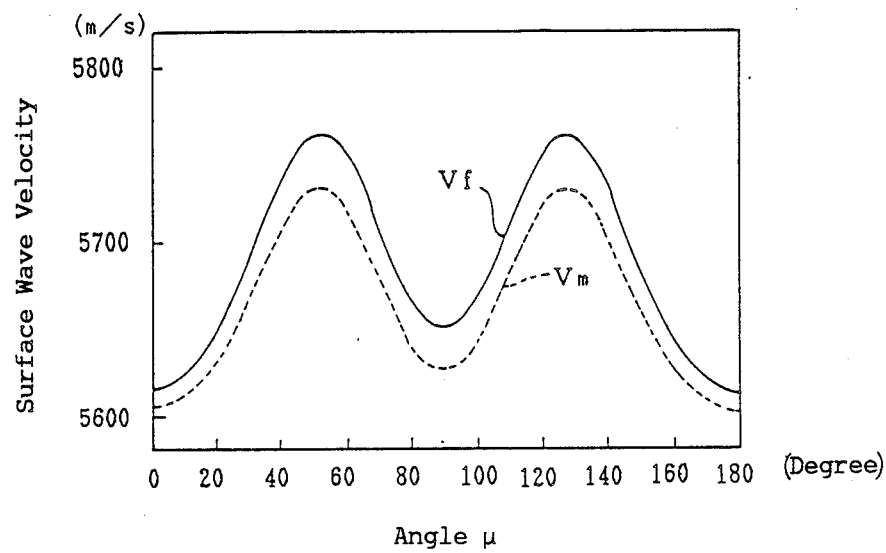
FIG. 3 is a graph showing variations in surface acoustic wave propagation velocity.

FIG. 3 shows the propagation velocities Vm and Vf calculated for the device of FIG. 1 using the angle $\mu$ as a parameter. The diagram indicates that both the propagation velocities Vm and Vf vary greatly with the angle $\mu$.

As disclosed in the above-mentioned literature "Communication with Surface Acoustic Waves and Application to Signal Processing," p. 16, the coupling coefficient is calculated from the following equation.

$$K^2 = 2(Vf - Vm)/Vf$$

Figure 4:
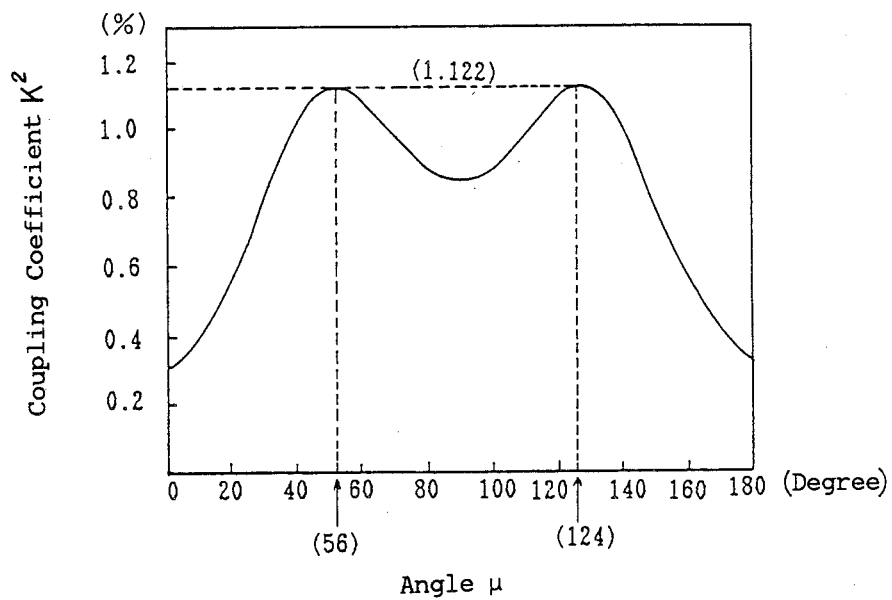
FIG. 4 is a graph showing variations in coupling coefficient.

FIG. 4 shows the coupling coefficient $K^2$ calculated from the data of FIG. 3. The diagram reveals that the coupling coefficient curve has two peaks at varying angles $\mu$. The coefficient exceeds 0.8% over the $\mu$ range of from about 30 degrees to about 150 degrees. The optimum values of angle $\mu$ are about 56 degrees and about 124 degrees, at which the coupling coefficient $K^2$ is 1.122.

The single crystal AlN film has the crystal structure of hexagonal system, and X-axis is elastically equivalent to Y-axis, so that the coupling coefficient remains unchanged even when the angle $\lambda$ in the Euler angle notation changes over the range of 0 to 180 degrees. While the angle $\theta$ is set to 90 degrees as in the prior art, we calculated the coupling coefficient in the same manner as above using the angle $\theta$ as a parameter to find that the angle $\theta$ is optimally 90 degrees.

Accordingly, when the wave propagation direction of the surface acoustic wave device having a single-crystal AlN film is expressed by ($\lambda,\mu,$90) in the Euler angle notation, $\lambda$ of 0 to 180 degrees and $\mu$ of 30 to 150 degrees, preferably $\mu$ of about 56 degrees or about 124 degrees, assure the device of higher performance than theretofore possible.

Such single crystal AlN film 2 can be formed by known CVD processes and sputtering process.

When the MO-CVD (metalorganic chemical vapor deposition) process is resorted to which is predominantly used as a CVD process, (0,0,$\theta$) (so-called Z-cut) or (45,90,90) AlN film is formed on a substrate as of sapphire single crystal, and the surface of the AlN film is thereafter ground to a specified angle with abrasive diamond grains. Alternatively when the sputtering process is employed, the substrate for forming the AlN film thereon is placed into a sputtering apparatus and inclined at a suitable angle with respect to the sputtering direction from the cathode to the anode, whereby an AlN film can be formed with Z-axis inclined according to the invention.

(Embodiment of surface acoustic wave device having c-axis-oriented AlN film)

With reference to FIG. 2, the substrate 1 is made of sapphire, silicon crystal, glass or quartz. The c-axis-oriented AlN film 21 is formed over the substrate 1. As illustrated, the film 21 has the direction W of c-Axis orientation within a vertical plane containing the direction 7 of propagation of the surface acoustic wave and a normal 6 to the piezoelectric film.

In the course of accomplishing the present invention, we checked the device for variations in coupling coefficient when the angle $\mu$ between the c-axis orientation direction W and the normal 6 was altered from 0 degree to 180 degrees.

The coupling coefficient can be calculated by the same method as used for the single crystal aluminum nitride film. The model of surface acoustic wave device constructed for the calculation exhibits the same result as achieved by the use of the single crystal AlN film. Accordingly, the calculation of the coupling coefficient $K^2$ affords the same result as shown in FIG. 4. More specifically, the coupling coefficient curve has two peaks at varying angles $\mu$, and the coefficient exceeds 0.8% when the angle $\mu$ is in the range of from about 30 degrees to about 150 degrees. The optimum values of angle $\mu$ are about 56 degrees and about 124 degrees, at which the coupling coefficient $K^2$ is 1.122%.

It is already known that with c-axis-oriented AlN films, a direction of propagation of the surface acoustic wave is elastically equivalent to a propagation direction opposite thereto and different therefrom by 180 degrees.

Figure 6:
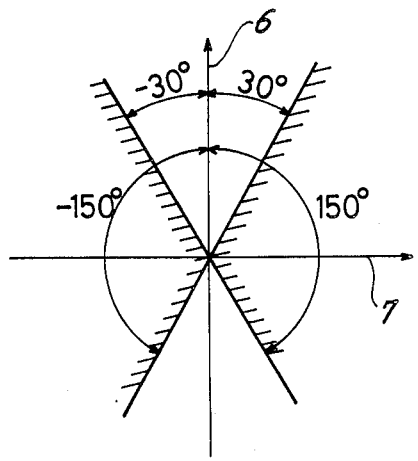
FIG. 6 is a diagram showing ranges of angles at which the direction of c-axis orientation is to be set.

Accordingly, the device shown in FIG. 2 can be adapted to exhibit exceedingly higher performance than conventionally possible when the c-axis orientation direction W shown is set in the hatched angular ranges of FIG. 6, that is, when $\mu$ is set to an angle in the range of +30 degrees to +150 degrees or in the range of −30 degrees to −150 degrees, more preferably when the angle $\mu$ is about +56 degrees or about +124 degrees.

Like tnhe film already described, the c-axis-oriented AlN film 21 can be prepared by the sputtering process or MO-CVD process.

Figure 7:
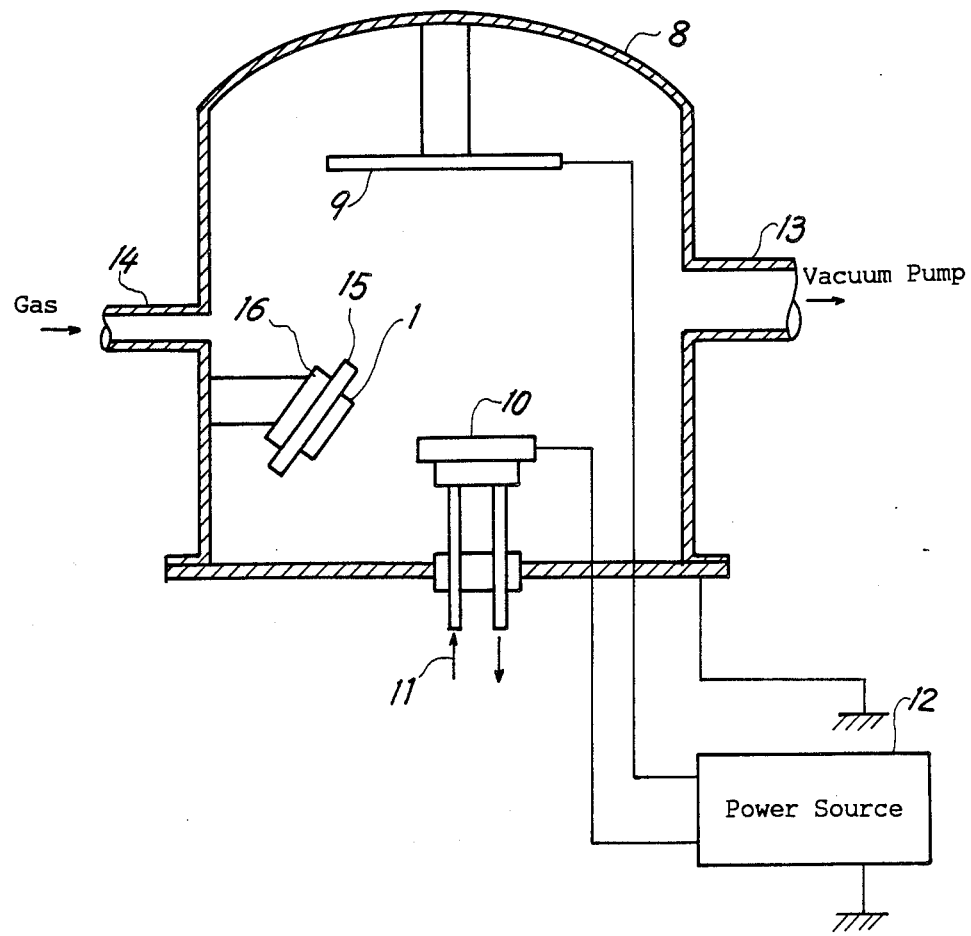
FIG. 7 is a diagram schematically showing the construction of a sputtering apparatus.

FIG. 7 shows a sputtering vacuum evaporation apparatus. A bell jar 8 is in communication with a vacuum pump via an evacuation pipe 13 and connected to a gas supply pipe 14, and has $Ar+N_2$ gas or $Ar+NH_3$ gas enclosed therein. Arranged within the bell jar 8 are an anode electrode 9 of Al or Cu, and a cathode electrode 10 opposed thereto and provided with an Al target. An d.c. or high-frequency high-voltage power supply 12 is connected to the electrodes. The cathode electrode 10 is cooled with cooling water 11.

A substrate 1 for forming an AlN film thereon faces the space between the cathode electrode 10 and the anode electrode 9 and is attached as inclined at a suitable angle to a holder 15. The holder 15 is equipped with a heater 16 for heating the substrate at 200° to 400° C. The angle at which the substrate 1 is to be positioned in place can be determined optimally by experiments.

The power supply 12, when turned on, causes a discharge across the cathode electrode 10 and the anode electrode 9, consequently forming on the substrate 1 an AlN film with an inclined c-axis.

As described above, the surface acoustic wave device of the present invention wherein the piezoelectric material is aluminum nitride has a higher coupling coefficient than the conventional devices.

The device of the present invention is not limited to the foregoing embodiments in construction but can be modified variously by one skilled in the art without departing from the scope of the invention as defined in the appended claims.

For example, although the AlN film 2 or 21 is formed on the surface of the substrate 1 of sapphire or the like according to the foregoing embodiments, the substrate 1 can be omitted when an AlN panel is prepared which has a thickness (e.g. at least about 50 micrometers) to afford sufficient strength.

What is claimed is:

1. A surface acoustic wave device having a single crystal aluminum nitride film as a piezoelectric film, characterized in that when the direction of propagation of the surface acoustic wave is expressed by ($\lambda,\mu,90$) according to the Euler angle notation, $\lambda$ is set to an angle in the range of 0 to 180 degrees, and $\mu$ to an angle in the range of 30 to 150 degrees.

2. A device as defined in claim 1 wherein $\mu$ is set to about 56 degrees or about 124 degrees.

3. A device as defined in claim 1 wherein the single crystal aluminum nitride film is formed on a substrate and has a thickness corresponding to length several times as long as a wavelength of the surface acoustic wave, the aluminum nitride film being provided on the surface thereof with a transmitting electrode and a receiving electrode opposed to each other.

4. A device as defined in claim 1 wherein the single crystal aluminum nitride film is in the form of a panel at least about 50 $\mu$m in thickness and is provided on the surface thereof with a transmitting electrode and a receiving electrode opposed to each other.

5. A surface acoustic wave device having a c-axis-oriented aluminum nitride film as a piezoelectric film, characterized in that the direction of c-axis orientation of the piezoelectric film is inclined within a plane containing the direction of propagation of the surface acoustic wave and perpendicular to the surface of the piezoelectric film at an angle in the range of ±30 degrees to ±150 degrees with respect to a normal to the piezoelectric film.

6. A device as defined in claim 5 wherein the angle between the normal to the piezoelectric film and the direction of c-axis orientation is set to about ±56 degrees or about ±124 degrees.

7. A device as defined in claim 5 wherein the c-axis-oriented aluminum nitride film is formed on a substrate and has a thickness corresponding to length several times as long as a wavelength of the surface acoustic wave, the aluminum nitride film being provided on the surface thereof with a transmitting electrode and a receiving electrode opposed to each other.

8. A device as defined in claim 5 wherein the c-axis-oriented aluminum nitride film is in the form of a panel at least 50 $\mu$m in thickness and is provided on the surface thereof with a transmitting electrode and a receiving electrode opposed to each other.

* * * * *

UNITED STATES PATENT AND TRADEMARK OFFICE
CERTIFICATE OF CORRECTION

PATENT NO. : 4,868,444
DATED : September 19, 1989
INVENTOR(S) : SHIBATA et al

It is certified that error appears in the above-identified patent and that said Letters Patent is hereby corrected as shown below:

On the cover page, Item [75], before "all of Japan" insert:

--Seiji Nishikawa, Ibaraki; Shoichi Nakano, Hirakata; Yukinori Kuwano, Katano,--.

Signed and Sealed this

Fourth Day of December, 1990

Attest:

HARRY F. MANBECK, JR.

*Attesting Officer*  *Commissioner of Patents and Trademarks*